(12) United States Patent
Takao et al.

(10) Patent No.: US 9,018,650 B2
(45) Date of Patent: Apr. 28, 2015

(54) SEMICONDUCTOR LIGHT EMITTING DEVICE

(71) Applicant: Rohm Co., Ltd., Kyoto (JP)

(72) Inventors: Masakazu Takao, Kyoto-fu (JP);
Mitsuhiko Sakai, Kyoto-fu (JP);
Kazuhiko Senda, Kyoto-fu (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/024,696

(22) Filed: Sep. 12, 2013

(65) Prior Publication Data

US 2014/0008610 A1     Jan. 9, 2014

Related U.S. Application Data

(62) Division of application No. 13/327,860, filed on Dec. 16, 2011, now Pat. No. 8,536,598, which is a division of application No. 12/596,004, filed on Oct. 15, 2009, now Pat. No. 8,106,412.

(30) Foreign Application Priority Data

Apr. 16, 2007     (JP) ................................ 2007-107130

(51) Int. Cl.
*H01L 33/00*      (2010.01)
*H01L 33/60*      (2010.01)
(Continued)

(52) U.S. Cl.
CPC ................ *H01L 33/60* (2013.01); *H01L 33/04* (2013.01); *H01L 33/30* (2013.01); *H01L 33/40* (2013.01); *H01L 33/46* (2013.01); *H01L 33/06* (2013.01)

(58) Field of Classification Search
CPC .......... H01L 33/06; H01L 33/30; H01L 33/04
USPC .................. 257/93, 98, 103, 94, 96
See application file for complete search history.

(56) References Cited

U.S. PATENT DOCUMENTS 5,376,580 A     12/1994   Kish et al.
5,898,192 A     4/1999   Gerner
(Continued)

FOREIGN PATENT DOCUMENTS

JP     06-302857 A     10/1994
JP     09-186365 A     7/1997
(Continued)

OTHER PUBLICATIONS

Search Report issued by European Patent Office on Nov. 28, 2013.
(Continued)

*Primary Examiner* — Ngan Ngo
(74) *Attorney, Agent, or Firm* — Rabin & Berdo, P.C.

(57) ABSTRACT

A high luminance semiconductor light emitting device including a metallic reflecting layer formed using a non-transparent semiconductor substrate is provided. The device includes a GaAs substrate; a metal layer disposed on the GaAs substrate; and a light emitting diode structure. The light emitting diode structure includes a patterned metal contact layer and a patterned insulating layer disposed on the metal layer, a p type cladding layer disposed on the patterned metal contact layer and the patterned insulating layer, a multi-quantum well layer disposed on the p type cladding layer, an n type cladding layer disposed on the multi-quantum well layer, and a window layer disposed on the n type cladding layer. The GaAs substrate and the light emitting diode structure are bonded by using the metal layer.

20 Claims, 14 Drawing Sheets

(51) Int. Cl.
*H01L 33/04* (2010.01)
*H01L 33/40* (2010.01)
*H01L 33/46* (2010.01)
*H01L 33/06* (2010.01)
*H01L 33/30* (2010.01)

(56) References Cited

U.S. PATENT DOCUMENTS

| | | | |
|---|---|---|---|
| 5,917,202 | A | 6/1999 | Haitz et al. |
| 7,019,323 | B2 * | 3/2006 | Shakuda et al. ............... 257/13 |
| 7,508,001 | B2 * | 3/2009 | Ueda et al. .................... 257/79 |
| 7,675,072 | B2 | 3/2010 | Konno et al. |
| 7,847,313 | B2 | 12/2010 | Shibata |
| RE42,422 | E | 6/2011 | Hsieh et al. |
| 8,049,243 | B2 | 11/2011 | Kamei et al. |
| 2002/0179929 | A1 * | 12/2002 | Takahashi et al. ........... 257/184 |
| 2003/0151044 | A1 | 8/2003 | Yamada |
| 2004/0079967 | A1 | 4/2004 | Shakuda et al. |
| 2005/0199904 | A1 | 9/2005 | Yamamoto |
| 2005/0205886 | A1 | 9/2005 | Murofushi et al. |
| 2005/0230690 | A1 * | 10/2005 | Hata .............................. 257/79 |
| 2006/0054899 | A1 * | 3/2006 | Takahashi et al. ............. 257/80 |
| 2006/0102933 | A1 | 5/2006 | Yamamoto |
| 2006/0237733 | A1 | 10/2006 | Yamada |
| 2007/0224714 | A1 | 9/2007 | Ikeda et al. |
| 2009/0203161 | A1 * | 8/2009 | Hashimoto .................... 438/39 |
| 2009/0275154 | A1 | 11/2009 | Suzuki et al. |
| 2010/0133505 | A1 | 6/2010 | Takao et al. |
| 2010/0230690 | A1 * | 9/2010 | Kyono et al. .................. 257/94 |
| 2012/0249009 | A1 * | 10/2012 | Walter et al. .................. 315/246 |
| 2013/0056707 | A1 | 3/2013 | Kozaki |

FOREIGN PATENT DOCUMENTS

| | | |
|---|---|---|
| JP | 2000-277804 A | 10/2000 |
| JP | 2003-218383 A | 7/2003 |
| JP | 2003-282946 A | 10/2003 |
| JP | 2004-080042 A | 3/2004 |
| JP | 2004-146593 A | 5/2004 |
| JP | 2005-123530 A | 5/2005 |
| JP | 2005-513787 A | 5/2005 |
| JP | 2005-259820 A | 9/2005 |
| JP | 2007-012688 A | 1/2007 |
| JP | 2008-103627 A | 5/2008 |
| WO | WO-03/052838 A2 | 6/2003 |
| WO | WO-2004/051758 A1 | 6/2004 |
| WO | WO-2004/082033 A1 | 9/2004 |
| WO | WO-2006/006556 A1 | 1/2006 |

OTHER PUBLICATIONS

Office Action issued by Korean Intellectual Property Office on Mar. 13, 2014 and English translation thereof.
Office Action issued on Jul. 29, 2014 by Taiwanese Patent Office.
Office Action issued Jul. 28, 2014 by State Intellectual Property Office of the People's Republic of China.

* cited by examiner

SEMICONDUCTOR LIGHT EMITTING DEVICE

This application is a divisional application of co-pending U.S. application Ser. No. 13/327,860, filed Dec. 16, 2011, which is a divisional application of Ser. No. 12/596,004, filed Oct. 15, 2009, which claims the foreign priority benefit of Japanese application Serial No. JP 2007-107130, filed Apr. 16, 2007. The contents of these applications are incorporated herein by reference.

TECHNICAL FIELD

The present invention relates to a semiconductor light emitting device and a fabrication method for the same, and in particular, relates to a semiconductor light emitting device formed for bonding a light emitting diode having a metallic reflecting layer, and a non-transparent substrate layer by wafer bonding technology, and a fabrication method for the same.

BACKGROUND ART

A structure which forms a metallic reflecting layer as an optical reflecting layer between a substrate and an active layer composed of an MQW (Multi-Quantum Well) layer is proposed in order to perform the high brightness of an LED (Light Emitting Diode). As a method of forming such a metallic reflecting layer, the wafer bonding technology of a substrate of a light emitting diode layer is disclosed in Patent Literature 1 and Patent Literature 2, for example.

In Patent Literature 1 and Patent Literature 2, the purpose is to provide a fabrication method of a light emitting diode which can fabricate a light emitting diode having a desired mechanical characteristic and optical transparency, and can make a minimum specific resistance of boundary surface between a transparent layer and a growth layer; and it is characterized by fabricating the light emitting diode by removing a temporary growth substrate after growing up a light emitting diode layer one after another on the temporary growth substrate and forming a light emitting diode structure having a relatively thin layer, and wafer-bonding a conductive and optical transparent substrate on the light emitting diode layer which becomes a buffer layer of lower layer on the position instead of the temporary growth substrate.

In Patent Literature 1 and Patent Literature 2, transparent materials, such as GaP and sapphire, are applied to the substrate used for the wafer bonding.

Patent Literature 1: Japanese Patent Application Laying-Open Publication No. H06-302857
Patent Literature 2: U.S. Pat. No. 5,376,580

A schematic cross-section structure of a conventional semiconductor light emitting device formed by the wafer bonding technology is expressed as shown in FIG. 23 to FIG. 25.

For example, as shown in FIG. 23, a conventional semiconductor light emitting device includes: an Au—Sn alloy layer 14 disposed on a GaAs substrate 15; a barrier metal layer 13 disposed on the Au—Sn alloy layer 14; a p type cladding layer 10 disposed on the barrier metal layer 13; an MQW layer 9 disposed on the p type cladding layer 10; an n type cladding layer 8 disposed on the MQW layer 9; and a window layer 7 disposed on the n type cladding layer 8.

In the conventional semiconductor light emitting device shown in FIG. 23, the metal used for the wafer bonding is Au—Sn alloy. As for the Au—Sn alloy, since the melting point is low, the Au—Sn alloy at the side of an epitaxial growth layer composing an LED in low temperature, and the Au—Sn alloy at the side of the GaAs substrate 15 can be melted and bonded.

However, since the thermal diffusion of Sn occurs when using the Au—Sn alloy layer 14, in order to prevent the diffusion of Sn, as shown in FIG. 23, it is necessary to insert the barrier metal layer 13. Moreover, there is a problem that the Au—Sn alloy layer 14 has a wrong optical reflection factor.

For example, as shown in FIG. 24, another conventional semiconductor light emitting device includes: a metallic reflecting layer 16 disposed on a GaAs substrate 15; a p type cladding layer 10 disposed on the metallic reflecting layer 16; an MQW layer 9 disposed on the p type cladding layer 10; an n type cladding layer 8 disposed on the MQW layer 9; and a window layer 7 disposed on the n type cladding layer 8. In the conventional semiconductor light emitting device shown in FIG. 24, there is a problem that light cannot be efficiently reflected in the metallic reflecting layer 16 fabricated by bonding the GaAs substrate 15 since the optical absorption occurs in the interface between metal and a semiconductor. That is, there is a problem that the optical absorption occurs in the interface between the p type cladding layer 10 and the metallic reflecting layer 16.

In order to perform high brightness of the semiconductor LED (Light Emitting Device), there is also a method of inserting a DBR (Distributed Bragg Reflector) layer between the GaAs substrate and the active layer (MQW) as an optical reflecting layer. The LED of the structure which does not insert the DBR becomes dark since the light which emitted in the MQW layer is absorbed by the GaAs substrate. Therefore, in order to perform the high brightness of the LED using the GaAs substrate, the DBR is used as the optical reflecting layer.

That is, as shown in FIG. 25, another conventional semiconductor light emitting device includes: a DBR layer 19 disposed on a GaAs substrate 15; a p type cladding layer 10 disposed on the DBR layer 19; an MQW layer 9 disposed on the p type cladding layer 10; an n type cladding layer 8 disposed on the MQW layer 9; and a window layer 7 disposed on the n type cladding layer 8. In the conventional semiconductor light emitting device shown in FIG. 25, the DBR layer 19 is used as an optical reflecting layer between the GaAs substrate 15 and the MQW layer 9. There is a problem that the DBR layer 19 reflects only an incident light from a certain one way, the DBR does not reflect light if an incident angle changes, and the DBR layer 19 does not reflects an incident light from other angle and then passes through the incident light. Therefore, there is a problem that the passed through light is absorbed by the GaAs substrate 15 and the light emitting brightness of the semiconductor LED (Light Emitting Device) is reduced.

The conventional semiconductor light emitting device formed by the wafer bonding technology needs to insert the barrier metal layer, in order to prevent the thermal diffusion of Sn, when using the Au—Sn alloy layer as a metal used for the wafer bonding. Moreover, the Au—Sn alloy layer has a wrong optical reflection factor.

Moreover, even if the metallic reflecting layer is formed by bonding the substrate, the optical absorption occurs in the interface between the metal and the semiconductor, and then the light cannot be reflected efficiently.

Moreover, when the DBR layer is used as the reflecting layer, the DBR layer reflects only an incident light from a certain one way, the DBR layer does not reflect and passes through the incident light if an incident angle changes, and the incident light is absorbed by the GaAs substrate, thereby the light emitting brightness of LED is reduced.

Then, the purpose of the present invention is to provide a semiconductor light emitting device with the high luminance formed by performing the wafer bonding of the substrate using a non-transparent semiconductor substrate, such as GaAs and Si, and forming the metallic reflecting layer, and a fabrication method for the same.

Moreover, the purpose of a present invention is to provide a semiconductor light emitting device with the high luminance formed by avoiding the contact between a semiconductor and metal, preventing the optical absorption in the interface between the semiconductor and the metal, and forming the metallic reflecting layer having a sufficient reflection factor, by inserting a transparent insulating film between the metal and the semiconductor, and a fabrication method for the same.

Moreover, the purpose of the present invention is to provide a semiconductor light emitting device with the high luminance which becomes possible to reflect the light of all angles by using not the DBR but a metal layer for the optical reflecting layer, and a fabrication method for the same.

SUMMARY OF INVENTION

One aspect of the semiconductor light emitting device of the present invention for achieving the above-mentioned purpose is characterized by comprising: a GaAs substrate structure including a GaAs layer, a first metal buffer layer disposed on a surface of the GaAs layer, a first metal layer disposed on the first metal buffer layer, a second metal buffer layer disposed at a back side of the GaAs layer, and a second metal layer disposed on a surface of an opposite side of the GaAs layer of the second metal buffer layer; and a light emitting diode structure disposed on the GaAs substrate structure and including a third metal layer, a metal contact layer disposed on the third metal layer, a p type cladding layer disposed on the metal contact layer, a multi-quantum well layer disposed on the p type cladding layer, an n type cladding layer disposed on the multi-quantum well layer, and a window layer disposed on the n type cladding layer, wherein the GaAs substrate structure and the light emitting diode structure are bonded by using the first metal layer and the third metal layer.

Another aspect of the semiconductor light emitting device of the present invention is characterized by comprising: a GaAs substrate; a metal layer disposed on the GaAs substrate; and a light emitting diode structure including a patterned metal contact layer and a patterned insulating layer disposed on the metal layer, a p type cladding layer disposed on the patterned metal contact layer and the patterned insulating layer, a multi-quantum well layer disposed on the p type cladding layer, an n type cladding layer disposed on the multi-quantum well layer, and a window layer disposed on the n type cladding layer, wherein the GaAs substrate and the light emitting diode structure are bonded by using the metal layer.

Another aspect of the semiconductor light emitting device of the present invention is characterized by comprising: a GaAs substrate structure including a GaAs substrate, and a first metal layer disposed on a surface of the GaAs substrate; and a light emitting diode structure disposed on the aforementioned GaAs substrate structure and including a second metal layer, a p type cladding layer disposed on the second metal layer, a multi-quantum well layer disposed on the p type cladding layer, an n type cladding layer disposed on the multi-quantum well layer, and a window layer disposed on the n type cladding layer, wherein the GaAs substrate and the light emitting diode structure are bonded by using the first metal layer and the second metal layer.

Another aspect of the semiconductor light emitting device of the present invention is characterized by comprising: a silicon substrate structure including a silicon substrate, a titanium layer disposed on the silicon substrate, and a first metal layer disposed on the titanium layer; and a light emitting diode structure including a second metal layer disposed on the first metal layer, a patterned metal contact layer and a patterned insulating layer disposed on the second metal layer, an epitaxial growth layer disposed on the patterned metal contact layer and the patterned insulating layer and having a frosting processing region on a surface exposed, a patterned n type GaAs layer disposed on the epitaxial growth layer, and a patterned surface electrode layer disposed on the n type GaAs layer, wherein the silicon substrate structure and the light emitting diode structure are bonded by using the first metal layer and the second metal layer.

Another aspect of the semiconductor light emitting device of the present invention is characterized by comprising: a GaAs substrate structure including a GaAs substrate, a metal buffer layer disposed on the GaAs substrate, and a first metal layer disposed on the metal buffer layer; and a light emitting diode structure including a second metal layer disposed on the first metal layer, a patterned metal contact layer and a patterned insulating layer disposed on the second metal layer, an epitaxial growth layer disposed on the patterned metal contact layer and the patterned insulating layer and having a frosting processing region on a surface exposed, a patterned n type GaAs layer disposed on the epitaxial growth layer, and a patterned surface electrode layer disposed on the n type GaAs layer, wherein the GaAs substrate structure and the light emitting diode structure are bonded by using the first metal layer and the second metal layer.

Another aspect of the fabrication method for the semiconductor light emitting device of the present invention is characterized by comprising: preparing a semiconductor substrate structure for wafer bonding and a light emitting diode structure for wafer bonding; forming a first metal layer on a semiconductor substrate in the semiconductor substrate structure; forming an AlInGaP layer on a GaAs substrate, an n type GaAs layer, and an epitaxial growth layer one after another in the light emitting diode structure; forming a metal contact layer and a second metal layer for a patterned insulating layer on the epitaxial growth layer; bonding the semiconductor substrate structure for the wafer bonding, and the light emitting diode structure for the wafer bonding by thermocompression bonding; removing the GaAs substrate by etching; removing an AlInGaP layer; performing pattern formation of a surface electrode layer; and removing the n type GaAs layers except the n type GaAs layer directly under the surface electrode layer by performing frosting processing.

BEST MODE FOR CARRYING OUT THE INVENTION

Figure 1:
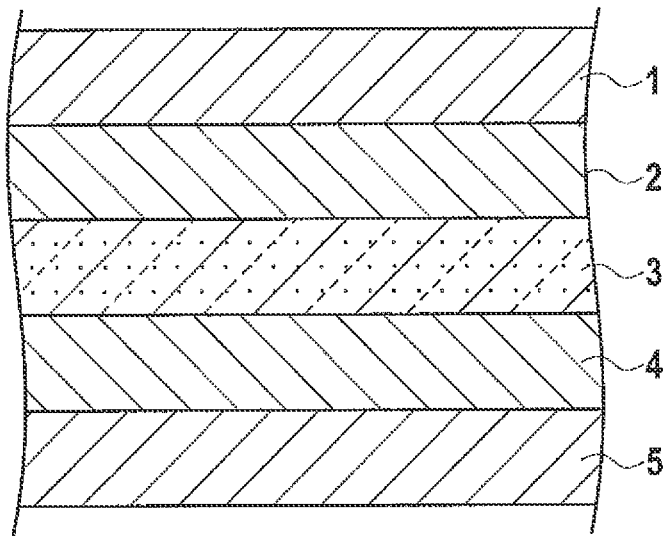
FIG. 1 is a schematic cross-sectional configuration diagram of a p type GaAs substrate applied to a semiconductor light emitting device and a fabrication method for the same according to a first embodiment of the present invention.

Next, an embodiment of the invention is described with reference to drawings. In the description of the following drawings, the same or similar reference numeral is attached to the same or similar part. However, a drawing is schematic and it should care about differing from an actual thing. Drawings are schematic, not actual, and may be inconsistent in between in scale, ratio, etc.

The embodiment shown in the following exemplifies the device and method for materializing the technical idea of the invention, and the technical idea of the invention does not specify assignment of each component parts, etc. as the following. Various changes can be added to the technical idea of the invention in scope of claims.

First Embodiment

Element Structure

It is applicable also in any of a p type and an n type, as a conductivity type of a GaAs substrate applied to a semiconductor light emitting device and a fabrication method for the same according to a first embodiment of the present invention.

Figure 2:
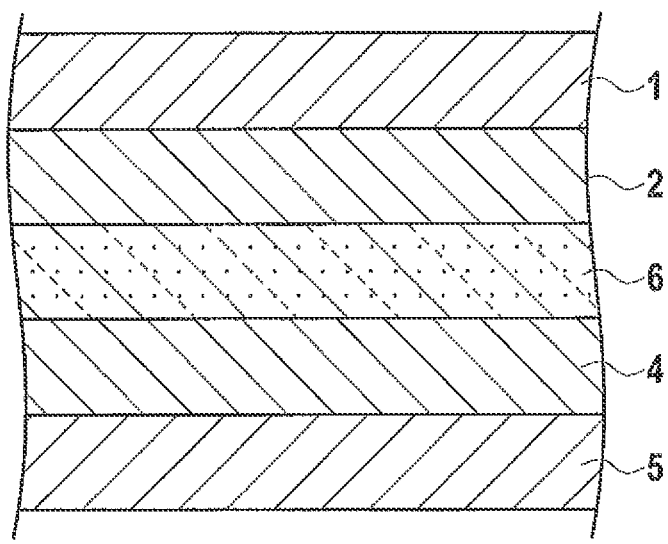
FIG. 2 is a schematic cross-sectional configuration diagram of an n type GaAs substrate applied to the semiconductor light emitting device and the fabrication method for the same according to the first embodiment of the present invention.

A schematic cross-section structure of a p type GaAs substrate applied to the semiconductor light emitting device and the fabrication method for the same according to the present embodiment is expressed as shown in FIG. 1. Moreover, a schematic cross-section structure of an n type GaAs substrate applied to the semiconductor light emitting device and the fabrication method according to the present embodiment for the same is expressed as shown in FIG. 2. Moreover, a schematic cross-section structure of an LED applied to the semiconductor light emitting device and a fabrication method for the same according to the present embodiment is expressed as shown in FIG. 3.

Figure 3:
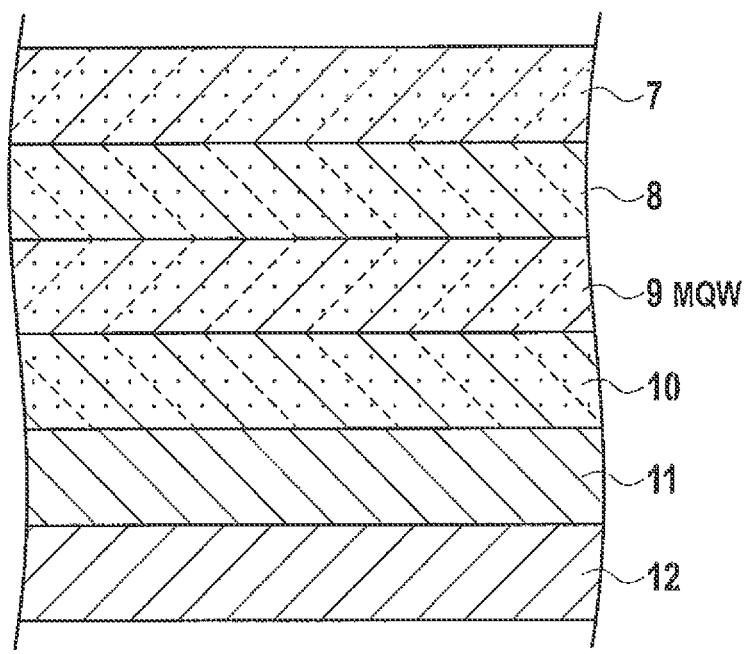
FIG. 3 is a schematic cross-sectional configuration diagram of an LED applied to the semiconductor light emitting device and the fabrication method for the same according to the first embodiment of the present invention.
Figure 4:
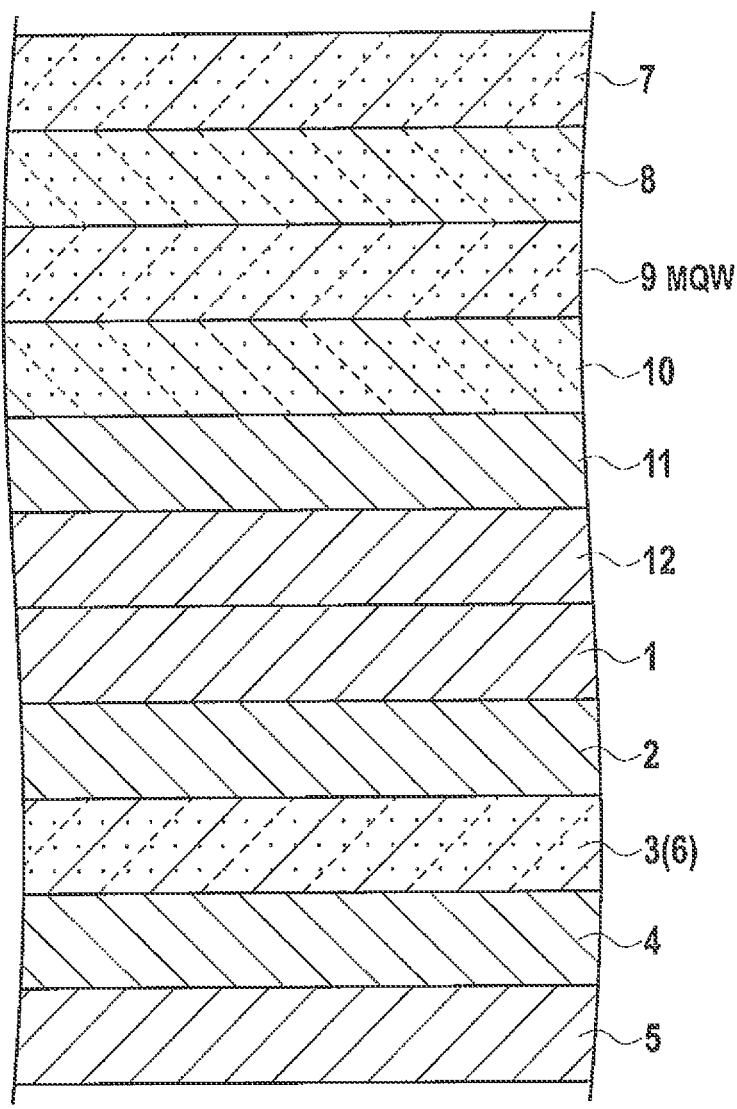
FIG. 4 is a schematic cross-sectional configuration diagram of the semiconductor light emitting device according to the first embodiment of the present invention.

A schematic cross-section structure of the semiconductor light emitting device according to the present embodiment formed by bonding mutually the LED shown in FIG. 3 with the p type GaAs substrate or the n type GaAs substrate shown in FIG. 1 or FIG. 2 by wafer bonding technology is expressed as shown in FIG. 4.

As shown in FIG. 1, the p type GaAs substrate applied to the semiconductor light emitting device and the fabrication method for the same according to the present embodiment includes: a p type GaAs layer 3; a metal buffer layer 2 disposed on the surface of the p type GaAs layer 3; a metal layer 1 disposed on the metal buffer layer 2; a metal buffer layer 4 disposed at the back side of the p type GaAs layer 3; and a metal layer 5 disposed on the surface of the opposite side at the side of the p type GaAs layer 3 of the metal buffer layer 4.

As shown in FIG. 2, the n type GaAs substrate applied to the semiconductor light emitting device and the fabrication method for the same according to the present embodiment includes: an n type GaAs layer 6; a metal buffer layer 2 disposed on the surface of the n type GaAs layer 6; a metal layer 1 disposed on the metal buffer layer 2; a metal buffer layer 4 disposed at the back side of the n type GaAs layer 6; and a metal layer 5 disposed on the surface of the opposite side at the side of the n type GaAs layer 6 of the metal buffer layer 4.

In the structure of FIG. 1, each the metal layers 1 and 5 are formed of an Au layer, and each the metal buffer layers 2 and 4 can be all formed, for example of an AuBe layer in order to achieve the electrical contact to the p type GaAs layer 3. Moreover, in the structure of FIG. 2, each the metal layers 1 and 5 are formed of an Au layer, and each the metal buffer layers 2 and 4 can be formed, for example of an AuGe layer in order to achieve the electrical contact to the n type GaAs layer 6.

As shown in FIG. 3, a schematic cross-section structure of the LED applied to the semiconductor light emitting device and the fabrication method for the same according to the present embodiment includes: a metal layer 12; a metallic contacts layer 11 disposed on the metal layer 12; a p type cladding layer 10 disposed on the metallic contacts layer 11; an MQW layer 9 disposed on the p type cladding layer 10; an n type cladding layer 8 disposed on the MQW layer 9; and a window layer 7 disposed on the n type cladding layer 8.

In the structure of FIG. 3, the metal layer 12 is formed, for example of an Au layer. Moreover, the metallic contacts layer 11 is formed, for example of an AuBe layer or an alloy layer of AuBe and Ni. The p type cladding layer 10 is formed of an AlGaAs layer or a multilayer structure of an AlGaAs layer applying the conductivity type as p⁻ type and an AlGaAs layer applying the conductivity type as p⁺ type, for example, and the thickness is about 0.1 μm, for example. The MQW layer 9 is composed of MQW (multi-quantum well) structure laminated by about 100 pairs of heterojunction pairs composed of a GaAs/GaAlAs layer, for example, and the thickness is formed in about 1.6 μm, for example. The n type cladding layer 8 is formed, for example of an n type AlGaAs layer, and the thickness is about 0.1 μm, for example. The window layer 7 is composed, for example of a multilayer structure of an AlGaAs layer, and a GaAs layer formed on the multilayer structure of the AlGaAs layer, and the whole thickness is about 0.95 μm.

As shown in FIG. 4, the semiconductor light emitting device according to the present embodiment is formed by bonding mutually the LED structure shown in FIG. 3 with the p type GaAs substrate or the n type GaAs substrate shown in FIG. 1 or FIG. 2 by the wafer bonding technology.

That is, as shown in FIG. 4, the semiconductor light emitting device according to the present embodiment is composed of: a p(n) type GaAs substrate structure including the p (n) type GaAs layer 3 (6), the metal buffer layer 2 disposed on the surface of the p (n) type GaAs layer 3 (6), the metal layer 1 disposed on the metal buffer layer 2, the metal buffer layer 4 disposed at the back side of the p (n) type GaAs layer 3 (6), and the metal layer 5 disposed on the surface of the opposite side at the side of the p (n) type GaAs layer 3 of the metal buffer layer 4 (6); and an LED structure disposed on the aforementioned p(n) type GaAs substrate, and including the metal layer 12, the metallic contacts layer 11 disposed on the metal layer 12, the p type cladding layer 10 disposed on the metallic contacts layer 11, the MQW layer 9 disposed on the p type cladding layer 10, the n type cladding layer 8 disposed on the MQW layer 9, and the window layer 7 disposed on the n type cladding layer 8.

In order to solve the problem of the Sn diffusion from the Au—Sn alloy layer, the p(n) type GaAs substrate structure and the LED structure which is composed of epitaxial growth layer are bonded by using the metal layer 1 and the metal layer 12. Accordingly, it is possible to form the metallic reflecting layer which does not need a barrier metal and has a sufficient reflection factor. The metallic reflecting layer is beforehand formed of the metal layer 12 disposed at the LED structure side. Since a mirror surface is formed of the interface between the p type cladding layer 10 and the metal layer 12, the radiated light from the LED is reflected in the aforementioned mirror surface. Although the metallic contacts layer 11 is a layer for achieving the ohmic contact of the metal layer 12 and the p type cladding layer 10, the metallic contacts layer 11 is intervened to the interface between the metal layer 12 and the p type cladding layer 10, and forms a part of the mirror surface.

As shown in FIG. 4, the semiconductor light emitting device according to the present embodiment can bond the metal layer 1 at the side of the GaAs substrate and the metal layer 12 at the side of the LED structure composed of the epitaxial growth layer by thermocompression bonding by forming both the metal layer 1 and the metal layer 12 with the Au layer.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example.

According to the semiconductor light emitting device according to the present embodiment, since the metallic reflecting layer having the effective optical reflection factor can be formed on the structure at the side of the LED by using the metal layer 12 composed of Au, the high brightness of LED can be achieved.

Second Embodiment

Element Structure

Figure 5:
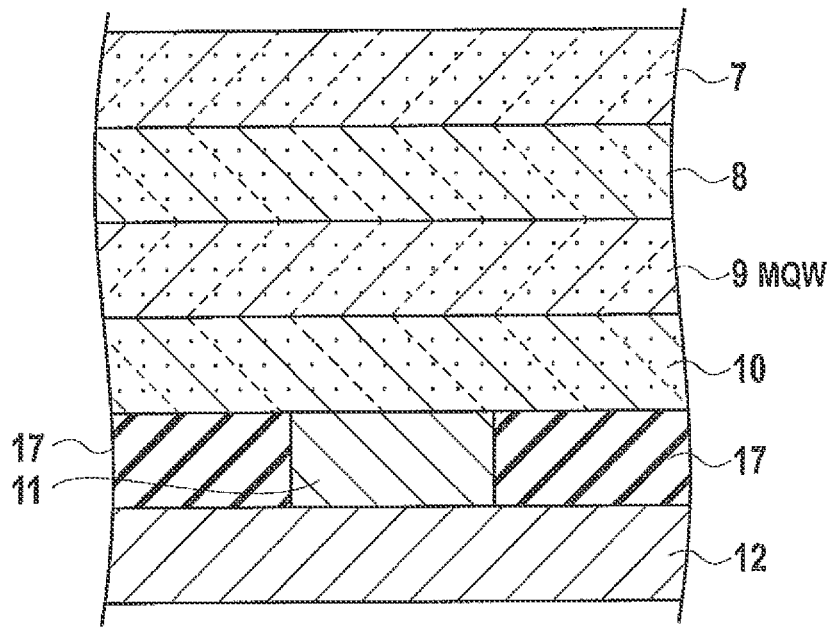
FIG. 5 is a schematic cross-sectional configuration diagram of an LED applied to a semiconductor light emitting device and a fabrication method for the same according to a second embodiment of the present invention.

A schematic cross-section structure of an LED applied to a semiconductor light emitting device and a fabrication method for the same according to a second embodiment of the present invention is expressed as shown in FIG. 5. Moreover, a schematic cross-section structure of an LED applied to a semiconductor light emitting device a fabrication method for the same according to a modified example of the present embodiment and is expressed as shown in FIG. 6.

Figure 6:
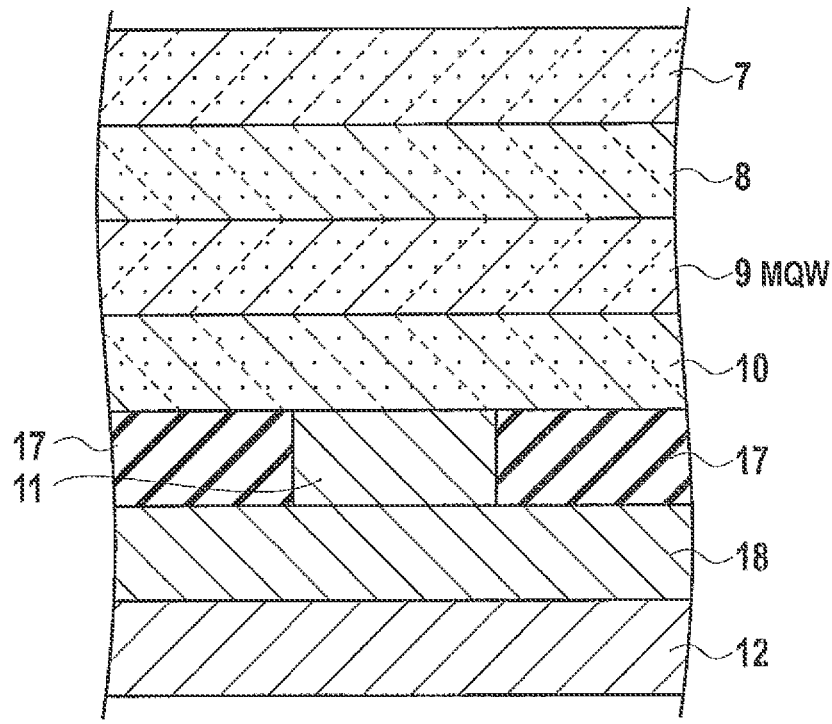
FIG. 6 is a schematic cross-sectional configuration diagram of an LED applied to a semiconductor light emitting device and a fabrication method for the same according to a modified example of the second embodiment of the present invention.
Figure 7:
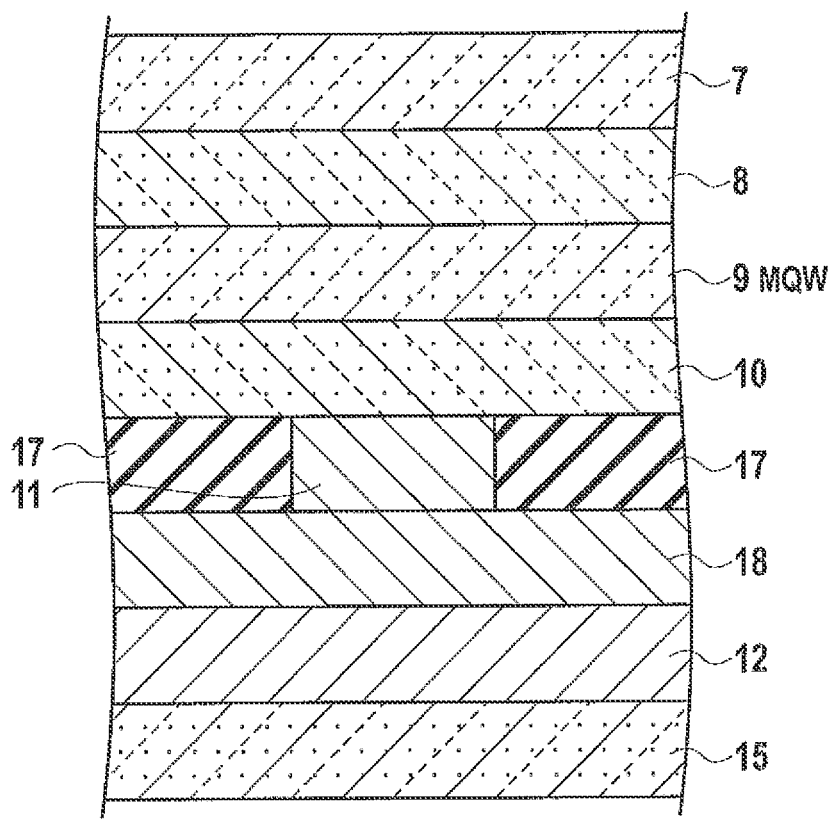
FIG. 7 is a schematic cross-sectional configuration diagram of the semiconductor light emitting device according to the second embodiment of the present invention.

A schematic cross-section structure of a semiconductor light emitting device according to the present embodiment formed by the wafer bonding technology by bonding mutually the LED shown in FIG. 6 with the p type or n type GaAs substrate 15 is expressed as shown in FIG. 7. In addition, in FIG. 7, the metal layer which is composed of Au layer for example, and is disposed on the GaAs substrate 15 is omitting illustration. Alternatively, it is also possible to bond the GaAs substrate 15 and the LED structure only by the metal layer 12, without disposing metal layers, such as an Au layer, on the GaAs substrate 15.

As shown in FIG. 5, the LED applied to the semiconductor light emitting device and the fabrication method for the same according to the present embodiment includes: a metal layer 12; a patterned metallic contacts layer 11 and a patterned insulating layer 17 disposed on the metal layer 12; a p type cladding layer 10 disposed on the patterned metallic contacts layer 11 and the patterned insulating layer 17; an MQW layer 9 disposed on the p type cladding layer 10; an n type cladding layer 8 disposed on the MQW layer 9; and a window layer 7 disposed on the n type cladding layer 8.

In the structure of FIG. 5, the metal layer 12 is formed, for example of an Au layer, and the thickness is about 2.5 to 5 μm, for example. Moreover, the metallic contacts layer 11 is formed, for example of an AuBe layer or an alloy layer of AuBe and Ni, for example. The thickness is the same grade as the insulating layer 17, for example, and is about 450 nm. The insulating layer 17 is formed, for example of a silicon dioxide film, a silicon nitride film, an SiON film, an $SiO_xN_y$ film, or these multilayer films. The p type cladding layer 10 is formed of an AlGaAs layer or a multilayer structure of an AlGaAs layer applying the conductivity type as p⁻ type and an AlGaAs layer applying the conductivity type as p⁺ type, for example, and the thickness is about 0.1 μm, for example. The MQW layer 9 is composed of an MQW (Multi-Quantum Well) structure which laminates about 100 pairs of hetero-junction pairs composed of a GaAs/GaAlAs layer, for example, and the thickness is formed in about 1.6 μm, for example. The n type cladding layer 8 is formed, for example of an n type AlGaAs layer, and the thickness is about 0.1 μm, for example. The window layer 7 is composed, for example of a multilayer structure of an AlGaAs layer, and a GaAs layer formed on the multilayer structure of the AlGaAs layer, and the whole thickness is about 0.95 μm.

Modified Example of Second Embodiment

As shown in FIG. 6, the LED applied to the semiconductor light emitting device and a fabrication method for the same according to the modified example of the present embodiment includes: a metal layer 12; a metal buffer layer 18 disposed on the metal layer 12; a patterned metallic contacts layer 11 and a patterned insulating layer 17 disposed on the metal buffer layer 18; a p type cladding layer 10 disposed on the patterned metallic contacts layer 11 and the patterned insulating layer 17; an MQW layer 9 disposed on the p type cladding layer 10; an n type cladding layer 8 disposed on the MQW layer 9; and a window layer 7 disposed on the n type cladding layer 8.

In the structure of FIG. 6, the metal buffer layer 18 is formed, for example of Ag, Al, Ni, Cr, or W layer. Since blue light and ultraviolet light are absorbed in the metal layer 12 composed of Au layer, it is preferable to provide the metal buffer layer 18 composed of Ag, Al, etc. in order to reflect the light at the side of such short wavelength. In the structure of FIG. 6, since each layers except the metal buffer layer 18 are formed as well as the structure of FIG. 5, the explanation is omitted.

The semiconductor light emitting device according to the present embodiment is formed by bonding mutually the LED structure shown in FIG. 5 to FIG. 6 and the GaAs substrate 15 by the wafer bonding technology, as shown in FIG. 7.

That is, as shown in FIG. 7, the semiconductor light emitting device according to the present embodiment is composed of: a GaAs substrate 15; a metal layer 12 disposed on the GaAs substrate 15; a metal buffer layer 18 disposed on the metal layer 12; a patterned metallic contacts layer 11 and a patterned insulating layer 17 disposed on the metal buffer layer 18; a p type cladding layer 10 disposed on the patterned metallic contacts layer 11 and the patterned insulating layer 17; an MQW layer 9 disposed on the p type cladding layer 10; an n type cladding layer 8 disposed on the MQW layer 9; and an LED structure including a window layer 7 disposed on the n type cladding layer 8.

It is possible to form the metallic reflecting layer having a sufficient reflection factor by bonding the GaAs substrate 15 and the LED structure composed of the epitaxial growth layer by using the metal layer 12. The metallic reflecting layer is beforehand formed of the metal layer 12 disposed at the LED structure side. Since a mirror surface is formed of the interface between the insulating layer 17, and the metal layer 12 or the metal buffer layer 18, the radiated light from the LED is reflected on the aforementioned mirror surface. Although the metallic contacts layer 11 is a layer for achieving the ohmic contact of the metal layer 12 or the metal buffer layer 18, and the p type cladding layer 10, the metallic contacts layer 11 is intervened to the interface between the metal layer 12 and the p type cladding layer 10, and has the thickness of the same grade as the insulating layer 17.

Since a substantial light emitting region is limited when the pattern width of the metallic contacts layer 11 is wide, the area efficiency reduces and the light emitting efficiency decreases. On the other hand, since the sheet resistivity of the metallic contacts layer 11 increases and the forward voltage Vf of the LED rises when the pattern width of the metallic contacts layer 11 is narrow, the optimal pattern width and pattern structure exist. In some examples of a pattern, there is a honeycomb pattern structure based on a hexagon or a dotted pattern structure based on a round shape. Such pattern shape will be explained in relation to a fourth embodiment, referring to FIG. 13 and FIG. 14.

As shown in FIG. 4, as for the semiconductor light emitting device related to the present embodiment, the metal layer (not shown) at the side of the GaAs substrate and the metal layer 12 at the side of the LED structure composed of the epitaxial growth layer can be bonded by thermocompression bonding by forming both the metal layer disposed on a GaAs substrate, and the metal layer 12 disposed at the LED side by the Au layer.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example.

According to the semiconductor light emitting device according to the present embodiment, the contact between the semiconductor layer, such as the p type cladding layer 10, and the metal layer 12 can be avoided, the optical absorption can be prevented, and the metallic reflecting layer having a sufficient reflection factor can be formed by forming the transparent insulating layer 17 between the metal layer 12 acting as the metallic reflecting layer or the metal buffer layer 18, and the semiconductor layer, such as the p type cladding layer 10.

In order to perform patterning formation of the transparent insulating layer 17 and to achieve ohmic contact, the metallic contacts layer 11 composed of AuBe etc. is vapor-deposited by lift off.

Then, the Au layer used for bonding with the GaAs substrate 15 on the insulating layer 17 is vapor-deposited, and the metal layer 12 is formed.

According to the semiconductor light emitting device according to the present embodiment, the high brightness of LED can be achieved since the contact the semiconductor layer, such as the p type cladding layer 10, with the metal layer 12 can be avoided, the optical absorption can be prevented, and the metallic reflecting layer having the sufficient reflection factor can be formed, by intervening the transparent insulating layer 17 between the metallic reflecting layer and the semiconductor layer.

Moreover, according to the semiconductor light emitting device according to the present embodiment, the light of short wavelength, such as ultraviolet rays having a low reflection factor, can be efficiently reflected on Au, and the high brightness of LED can be achieved by forming the metal buffer layer 18 composed of Ag, Al, etc. between the insulating layer 17 and the metal layer 12.

Moreover, according to the semiconductor light emitting device according to the present embodiment, since the light is not absorbed in the interface between the p type cladding layer and the metallic reflecting layer, the high brightness of LED can be achieved.

Third Embodiment

Element Structure

Figure 8:
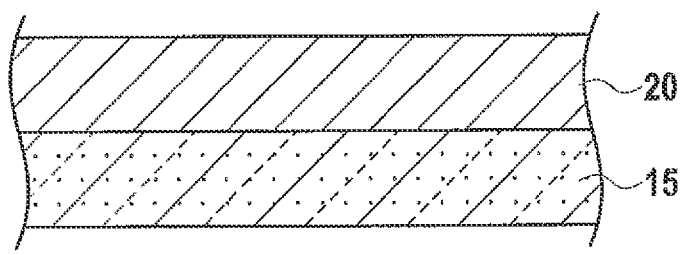
FIG. 8 is a schematic cross-sectional configuration diagram of a GaAs substrate applied to a semiconductor light emitting device and a fabrication method for the same according to a third embodiment of the present invention.

A schematic cross-section structure of a GaAs substrate applied to a semiconductor light emitting device and a fabrication method for the same according to a third embodiment of the present invention is expressed as shown in FIG. 8. Moreover, a schematic cross-section structure of an LED applied to the semiconductor light emitting device and a fabrication method for the same according to the present embodiment is expressed as shown in FIG. 9.

Figure 9:
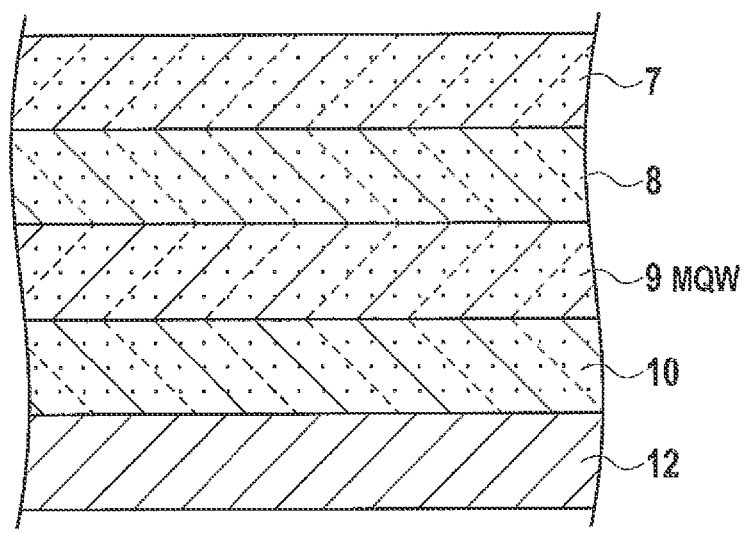
FIG. 9 is a schematic cross-sectional configuration diagram of an LED applied to the semiconductor light emitting device and the fabrication method for the same according to the third embodiment of the present invention.
Figure 10:
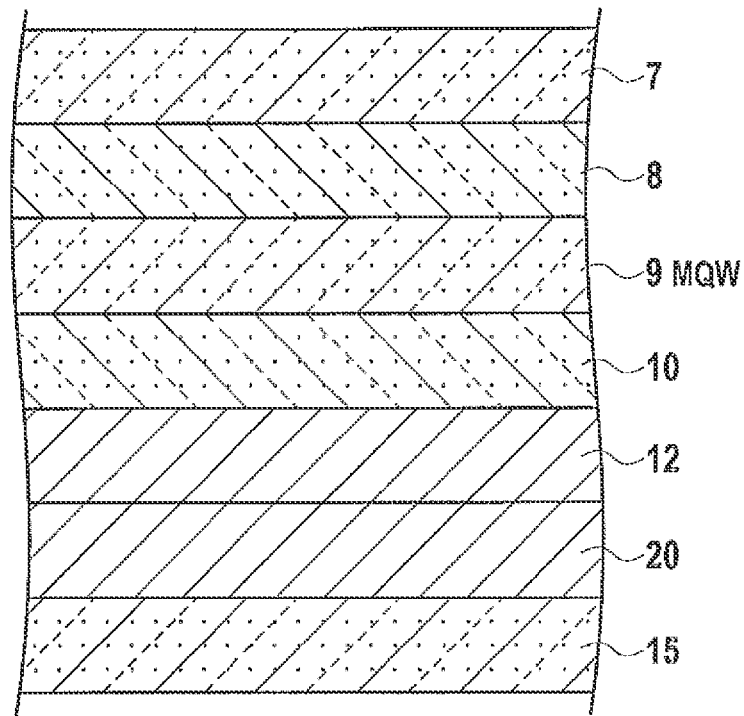
FIG. 10 is a schematic cross-sectional configuration diagram of the semiconductor light emitting device according to the third embodiment of the present invention.

A schematic cross-section structure of the semiconductor light emitting device according to the third embodiment of the present invention formed by bonding mutually the GaAs substrate 15 provided with the metal layer 20 shown in FIG. 8 and the LED shown in FIG. 9 by the wafer bonding technology is expressed as shown in FIG. 10.

A p type or n type GaAs substrate structure applied to a semiconductor light emitting device and the fabrication method for the same according to the present embodiment includes a GaAs substrate 15 and a metal layer 20 disposed on the surface of the GaAs substrate 15, as shown in FIG. 8.

In the structure of FIG. 8, the metal layer 20 is formed, for example of an Au layer.

As shown in FIG. 9, a schematic cross-section structure of the LED applied to the semiconductor light emitting device and the fabrication method for the same according to the present embodiment includes: a metal layer 12; a p type cladding layer 10 disposed on the metal layer 12; an MQW layer 9 disposed on the p type cladding layer 10; an n type cladding layer 8 disposed on the MQW layer 9; and a window layer 7 disposed on the n type cladding layer 8.

In the structure of FIG. 9, the metal layer 12 is formed, for example of an Au layer, and the thickness is about 1 μm. Moreover, the p type cladding layer 10 is formed of an AlGaAs layer or a multilayer structure of an AlGaAs layer applying the conductivity type asp⁻ type and the AlGaAs layer applying the conductivity type as p⁺ type, for example, and the whole thickness is formed in about 0.1 μm, for example. The MQW layer 9 is composed of an MQW (Multi-Quantum Well) structure which laminates about 80 to 100 pairs of heterojunction pairs composed of a GaAs/GaAlAs layer, for example, and the whole thickness is formed in about 1.6 μm, for example. The n type cladding layer 8 is formed, for example of an n type AlGaAs layer, and the thickness is about 0.1 μm, for example. The window layer 7 is composed, for example of a multilayer structure of an AlGaAs layer, and a GaAs layer formed on the multilayer structure of the AlGaAs layer, and the whole thickness is about 0.95 μm.

As shown in FIG. 10, the semiconductor light emitting device according to the present embodiment is formed by bonding mutually the LED structure shown in FIG. 9 with the p type or n type GaAs substrate shown in FIG. 8 by the wafer bonding technology.

That is, as shown in FIG. 10, the semiconductor light emitting device according to the present embodiment is composed of: a GaAs substrate structure including the GaAs substrate 15, and the metal layer 20 disposed on the surface of the GaAs substrate 15; and an LED structure disposed on the aforementioned GaAs substrate structure and including the metal layer 12, the p type cladding layer 10 disposed on the metal layer 12, the MQW layer 9 disposed on the p type cladding layer 10, the n type cladding layer 8 disposed on the MQW layer 9, and the window layer 7 disposed on the n type cladding layer 8.

The metallic reflecting layer is beforehand formed of the metal layer 12 disposed at the LED structure side. Since a mirror surface is formed of the interface between the p type cladding layer 10 and the metal layer 12, the radiated light from the LED is reflected in the aforementioned mirror surface.

As shown in FIG. 10, the semiconductor light emitting device according to the present embodiment can bond the metal layer 20 at the side of the GaAs substrate and the metal layer 12 at the side of the LED structure composed of the epitaxial growth layer by thermocompression bonding by forming both the metal layer 20 and the metal layer 12 with the Au layer.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example.

According to the semiconductor light emitting device and the fabrication method for the same according to the present embodiment, it has the characteristic at the point of performing total reflection of the light by using the metal for the reflecting layer in order to prevent the optical absorption to the GaAs substrate, and preventing the absorption to the GaAs substrate. As a material of the semiconductor substrate to bond, non-transparent semiconductor substrate materials, such as GaAs and Si, are used.

The metal layer 20 and the metal layer 12 are bonding by using the Au layer as the metal layer 20 at the side of the GaAs substrate 15 and using the Au layer also as the metal layer 12 at the side of the LED including the epitaxial growth layer, and the metal layer 12 used for bonding is applied to the optical reflecting layer as the metallic reflecting layer.

According to the semiconductor light emitting device and the fabrication method for the same according to the present embodiment, the high brightness of the LED can be performed since it is possible to perform total reflection of the light by using the metal for the reflecting layer, to prevent the absorption to the GaAs substrate, and to reflect the light of all angles, in order to prevent the optical absorption to the GaAs substrate.

Fourth Embodiment

Element Structure

Figure 11:
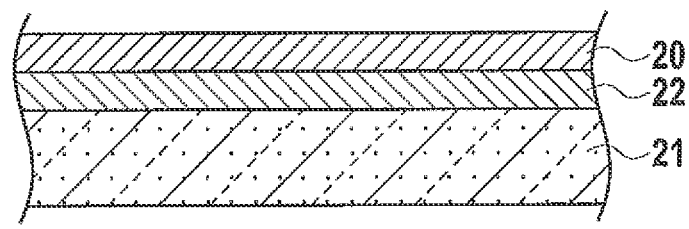
FIG. 11 is a schematic cross-sectional configuration diagram of an Si substrate applied to a semiconductor light emitting device and a fabrication method for the same according to a fourth embodiment of the present invention.
Figure 12:
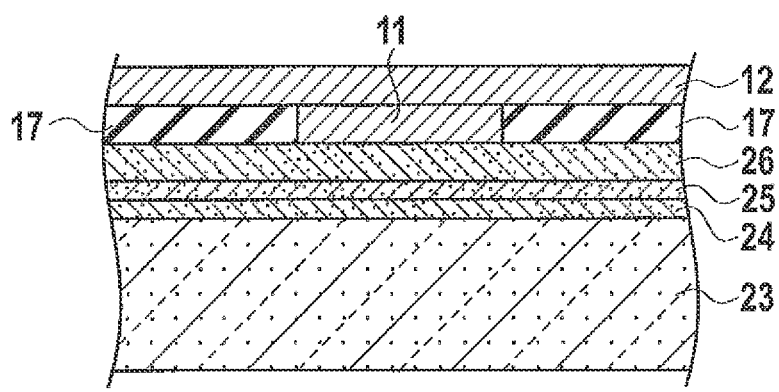
FIG. 12 is a schematic cross-sectional configuration diagram of an LED applied to the semiconductor light emitting device and the fabrication method for the same according to the fourth embodiment of the present invention.
Figure 13:
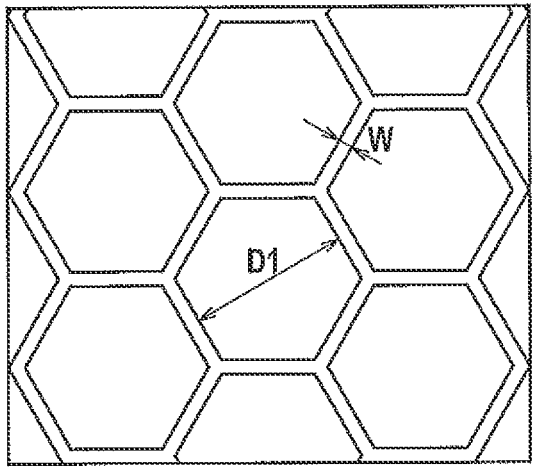
FIG. 13 is a schematic plane pattern structural drawing of the LED applied to the semiconductor light emitting device and the fabrication method for the same according to the fourth embodiment of the present invention.
Figure 14:
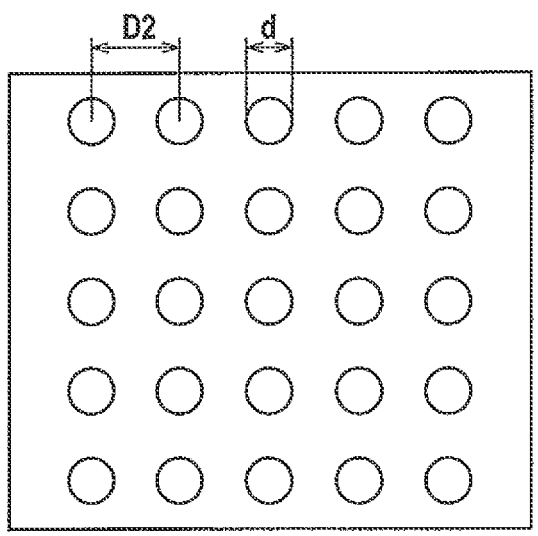
FIG. 14 is another schematic plane pattern structural drawing of the LED applied to the semiconductor light emitting device and the fabrication method for the same according to the fourth embodiment of the present invention.

A schematic cross-section structure of a silicon substrate applied to a semiconductor light emitting device and a fabrication method for the same according to a fourth embodiment of the present invention is expressed as shown in FIG. 11. Moreover, a schematic cross-section structure of an LED applied to the semiconductor light emitting device and a fabrication method for the same according to the present embodiment is expressed as shown in FIG. 12. A schematic plane pattern structure of the LED applied to the semiconductor light emitting device and the fabrication method for the same according to the present embodiment is expressed as shown in FIG. 13. Moreover, another schematic plane pattern structure is expressed as shown in FIG. 14.

As shown in FIG. 11, the silicon substrate 21 applied to the semiconductor light emitting device and the fabrication method for the same according to the present embodiment includes a silicon substrate 21, a titanium (Ti) layer 22 disposed on the surface of the silicon substrate 21, and a metal layer 20 disposed on the surface of the titanium (Ti) layer 22.

In the structure of FIG. 11, the thickness of the silicon substrate 21 is about 130 µm, for example. The metal layer 20 is formed, for example of an Au layer, and the thickness is about 2.5 µm.

As shown in FIG. 12, the LED applied to the semiconductor light emitting device and the fabrication method for the same according to the present embodiment includes: a GaAs substrate 23; an AlInGaP layer 24 disposed on the GaAs substrate 23; an n type GaAs layer 25 disposed on the AlInGaP layer 24; an epitaxial growth layer 26 disposed on the n type GaAs layer 25; a patterned metallic contacts layer 11 and a patterned insulating layer 17 disposed on the epitaxial growth layer 26; and a metal layer 12 disposed on the patterned metallic contacts layer 11 and the patterned insulating layer 17.

In the structure of FIG. 12, the thickness of the GaAs substrate 23 is about 300 µm, for example, and the thickness of the AlInGaP layer 24 is about 350 nm, for example. Moreover, the n type GaAs layer 25 functions as a contact layer between the GaAs substrate 23 and the epitaxial growth layer 26 via the AlInGaP layer 24, and the thickness is about 500 nm, for example. The epitaxial growth layer 26 includes: an n type window layer composed of an AlGaAs layer; an n type cladding layer; an MQW layer composed of a plurality of pairs of the heterojunction of GaAs/AlGaAs; an n type cladding layer composed of an AlGaAs layer; and a p type window layer composed of an AlGaAs layer/GaP layer. The MQW layer is composed of an MQW (Multi-Quantum Well) structure which laminates about 100 pairs of heterojunction pairs composed of a GaAs/GaAlAs layer, for example, and the thickness is formed in about 1.6 µm, for example.

Moreover, the metallic contacts layer 11 is formed, for example of an AuBe layer or an alloy layer of AuBe and Ni, for example. The thickness is the same grade as the insulating layer 17, and is about 450 nm.

The metallic contacts layer 11 may be formed, for example as layered structure, such as Au/AuBe—Ni alloy/Au. The insulating layer 17 is formed, for example of a silicon dioxide film, a silicon nitride film, an SiON film, an $SiO_xN_y$ film, or these multilayer films.

The metal layer 12 is formed, for example of an Au layer, and the thickness is about 2.5 to 5 µm, for example. The p type cladding layer in the epitaxial growth layer 26 is formed of an AlGaAs layer or a multilayer structure of an AlGaAs layer applying the conductivity type as $p^-$ type and an AlGaAs layer applying the conductivity type as $p^+$ type, for example, and the thickness is about 0.1 µm, for example. The n type cladding layer in the epitaxial growth layer 26 is formed, for example of a n type AlGaAs layer, and the thickness is about 0.1 µm, for example. An n type window layer is composed, for example of a multilayer structure of an AlGaAs layer and a GaAs layer formed on the multilayer structure of the AlGaAs layer, and the whole thickness is about 0.95 µm, for example. A p type window layer is composed, for example of a multi-layer structure of an AlGaAs layer and a GaP layer formed on the multilayer structure of the AlGaAs layer, and the whole thickness is about 0.32 µm, for example.

Figure 20:
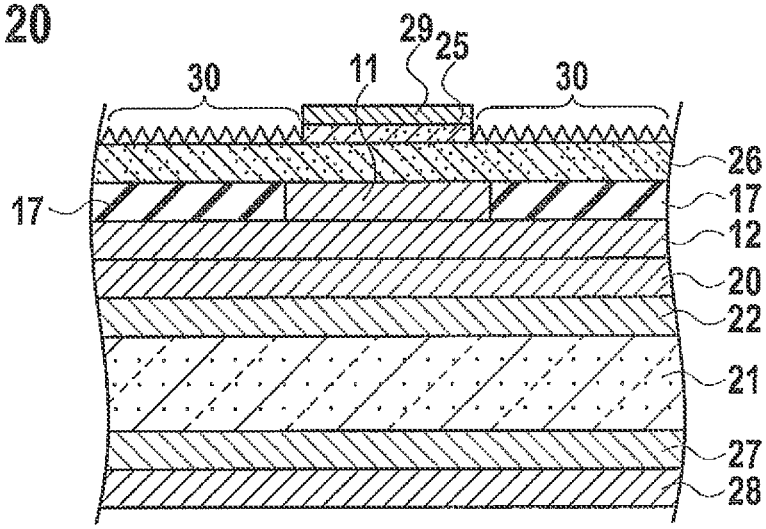
FIG. 20 is a schematic cross-sectional configuration diagram for explaining one process of the fabrication method of the semiconductor light emitting device according to the fourth embodiment of the present invention.

As shown in FIG. 20, the semiconductor light emitting device according to the present embodiment is formed by bonding mutually the silicon substrate structure shown in FIG. 11, and the LED structure shown in FIG. 12 by the wafer bonding technology.

Figure 21:
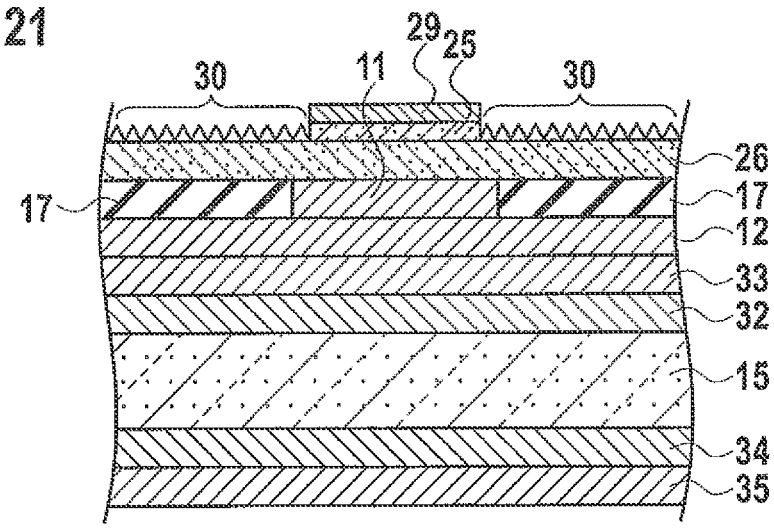
FIG. 21 is a schematic cross-sectional configuration diagram for explaining one process of a fabrication method of a semiconductor light emitting device according to a modified example of the fourth embodiment of the present invention.
Figure 22:
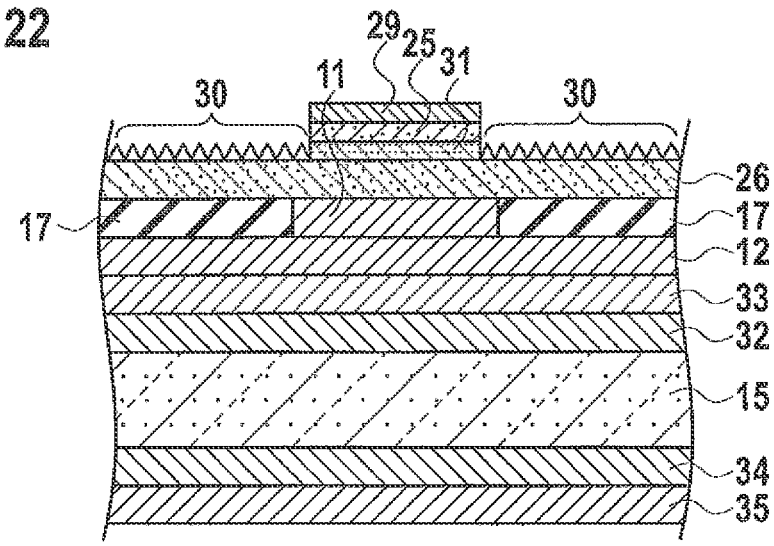
FIG. 22 is a schematic cross-sectional configuration diagram for explaining one process of a fabrication method of a semiconductor light emitting device according to another modified example of the fourth embodiment of the present invention.
Figure 23:
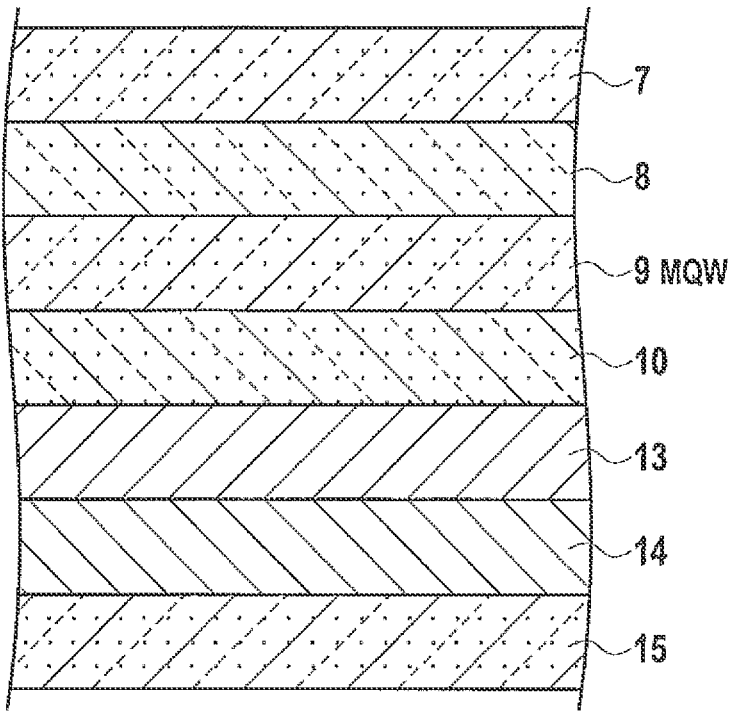
FIG. 23 is a schematic cross-sectional configuration diagram of a conventional semiconductor light emitting device.
Figure 24:
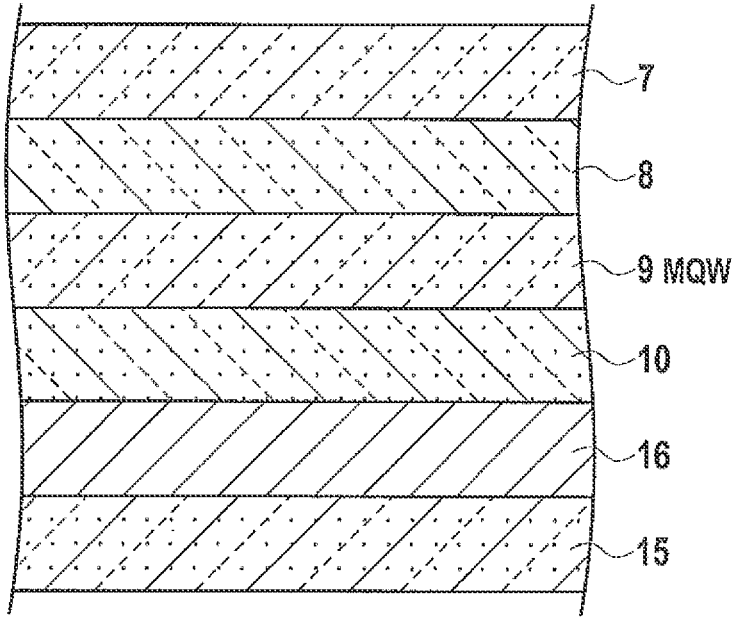
FIG. 24 is another schematic cross-sectional configuration diagram of the conventional semiconductor light emitting device.
Figure 25:
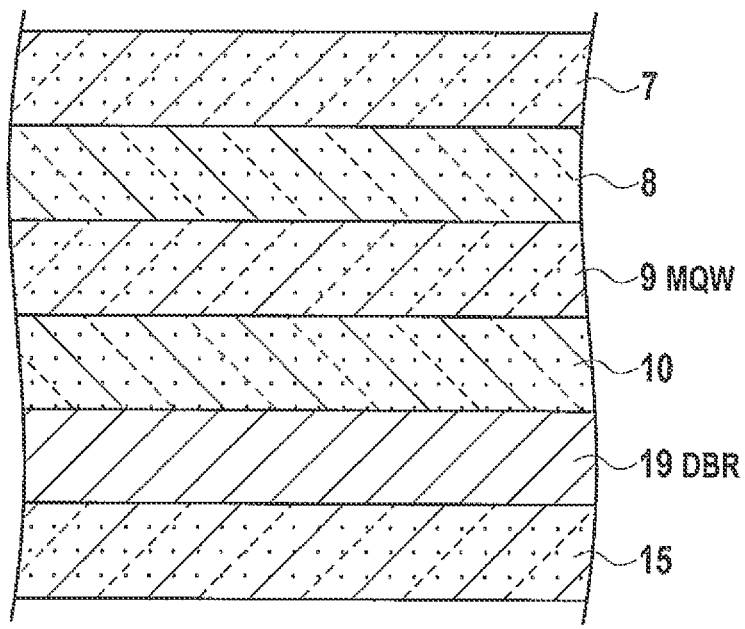
FIG. 25 is another schematic cross-sectional configuration diagram of the conventional semiconductor light emitting device.

That is, as shown in FIG. 20, the semiconductor light emitting device according to the present embodiment includes: a silicon substrate structure composed of a silicon substrate 21, a titanium layer 22 disposed on the silicon substrate 21, and a metal layer 20 disposed on the titanium layer 22; and an LED structure composed of a metal layer 12 disposed on the metal layer 20, a patterned metallic contacts layer 11 and a patterned insulating layer 17 disposed on the metal layer 12, an epitaxial growth layer 26 disposed on the patterned metallic contacts layer 11 and the patterned insulating layer 17 and having a frosting processing region 30 (region formed by performing frosting processing of the exposed n type GaAs layer 25) on the exposed surface, a patterned n type GaAs layer 25 disposed on the epitaxial growth layer 26, and a patterned surface electrode layer 29 disposed on the n type GaAs layer 25 similarly. In addition, in the silicon substrate structure, a titanium layer 27 and a back surface electrode layer 28 are disposed at the back side of the silicon substrate 21. Moreover, a blocking layer 31 for preventing current concentration may be disposed between the epitaxial growth layer 26 and the n type GaAs layer 25, as shown in FIG. 21 and FIG. 22 which are described later. As a material of the blocking layer 31 in this case, GaAs can be applied, and the thickness is about 500 nm, for example.

Also in the semiconductor light emitting device according to the present embodiment, as shown in FIG. 20, it is possible to form a metallic reflecting layer having a sufficient reflection factor by bonding the silicon substrate structure and the LED structure composed of the epitaxial growth layer by using the metal layer 12. The metallic reflecting layer is beforehand formed of the metal layer 12 disposed at the LED structure side. Since a mirror surface is formed of the interface between the insulating layer 17 and the metal layer 12, the radiated light from the LED is reflected in the aforementioned mirror surface. Although the metallic contacts layer 11 is a layer for achieving the ohmic contact of the metal layer 12 and the epitaxial growth layer 26, the metallic contacts layer 11 is intervened to the interface between the metal layer 12 and the epitaxial growth layer 26, and has the thickness of the same grade as the insulating layer 17.

(Plane Pattern Structure)

Since a substantial light emitting region is limited when the pattern width of the metallic contacts layer 11 is wide, the area efficiency reduces and the light emitting efficiency decreases. On the other hand, when the pattern width of the metallic contacts layer 11 is narrow, the sheet resistivity of the metallic contacts layer 11 increases and the forward voltage Vf of LED rises. Accordingly, there are the optimal pattern width W and the pattern pitch D1. In some examples of the pattern, there is a honeycomb pattern structure based on a hexagon or a circular dotted pattern structure based on a circular dotted shape basic structure.

A schematic plane pattern structure of the LED applied to the semiconductor light emitting device and the fabrication method for the same according to the present embodiment has the honeycomb pattern structure based on a hexagonal basic structure, for example, as shown in FIG. 13. In FIG. 13, the shaped part shown by the width W shows a pattern of the metallic contacts layer 11 formed, for example of an AuBe layer or an alloy layer of AuBe and Ni also in FIG. 12. The hexagonal pattern having the width D1 is equivalent to a part of the insulating layer 17, and expresses a region where the radiated light from LED is guided. The width D1 is about 100 μm, for example, and the line width W is about 5 μm to about 11 μm.

Another schematic plane pattern structure of the LED applied to the semiconductor light emitting device and the fabrication method for the same according to the present embodiment has a dotted pattern structure based on a round shape, for example, as shown in FIG. 14. In FIG. 14, the shaped part shown by the width d shows a pattern of the metallic contacts layer 11 formed of an AuBe layer or an alloy layer of AuBe and Ni in FIG. 12, and is disposed by the pattern pitch having the width D2. In FIG. 14, the region except the circular pattern part having the width d and the pattern pitch D2 is equivalent to a part of the insulating layer 17, and expresses a region where the radiated light from LED is guided. The pattern pitch D2 is about 100 μm, for example, and the width d is about 5 μm to about 11 μm.

The schematic plane pattern structure of the LED applied to the semiconductor light emitting device the fabrication method for the same according to the present embodiment and is not limited to the hexagonal honeycomb pattern and the circular dotted pattern, but a random pattern for disposing a triangular pattern, a rectangular pattern, a hexagonal pattern, an octagonal pattern, a circular dotted pattern, etc. at random is also applicable.

The schematic plane pattern structure of the LED applied to the semiconductor light emitting device according to the present embodiment has only to be able to secure the metal wiring pattern width which is a level in which the forward voltage Vf of LED does not rise without reducing the light emitting brightness from the LED securing the size of a light guide region.

(Fabrication Method)

The fabrication method of the semiconductor light emitting device according to the present embodiment will be explained hereinafter.

Schematic cross-section structures for explaining one process of the fabrication method of the semiconductor light emitting device according to the present embodiment is expressed as shown in FIG. 11 to FIG. 20.

(a) First of all, a silicon substrate structure for wafer bonding is prepared as shown in FIG. 11, and an LED structure for wafer bonding is prepared as shown in FIG. 12. In the silicon substrate structure, the titanium layer 22 and the metal layer 20 composed of Au, etc. are formed one after another using a spattering technique, a vacuum evaporation technique, etc. on the silicon substrate 21. In the LED structure, the AlInGaP layer 24 on the GaAs substrate 23, the n type GaAs layer 25, and the epitaxial growth layer 26 are formed one after another using an MBE (Molecular Beam Epitaxy) method, an MOCVD (Metal Organic Chemical Vapor Deposition) method, etc. Next, the metallic contacts layer 11 and the metal layer 12 are formed for the patterned insulating layer 17 on the epitaxial growth layer 26 by using a lift off method.

Figure 15:
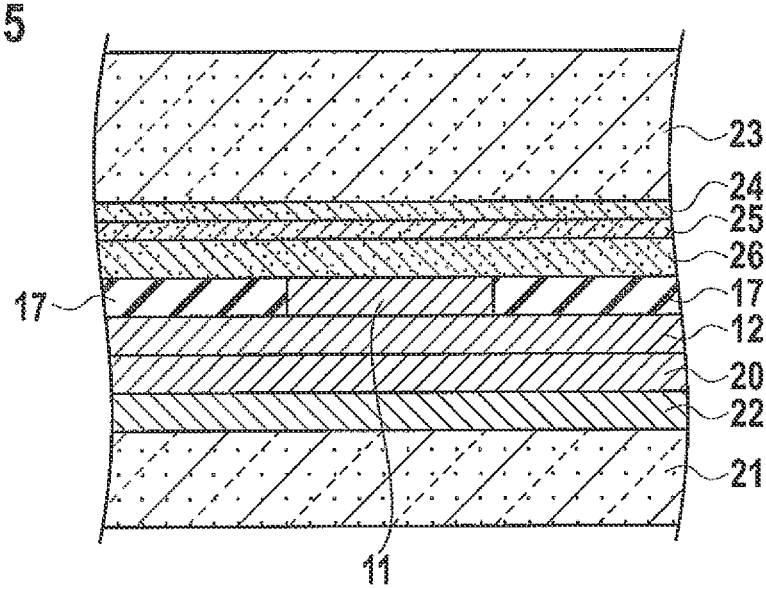
FIG. 15 is a schematic cross-sectional configuration diagram for explaining one process of the fabrication method of the semiconductor light emitting device according to the fourth embodiment of the present invention.

(b) Next, as shown in FIG. 15, the silicon substrate structure for wafer bonding shown in FIG. 11, and the LED structure for wafer bonding shown in FIG. 12 are bonded. In the bonding process, it performs on the conditions for about 340 degrees C. as a thermocompression bonding temperature, about 18 MPa as a thermocompression bonding pressure, and about 10 minutes as thermocompression bonding time, by using a pressing machine, for example.

Figure 16:
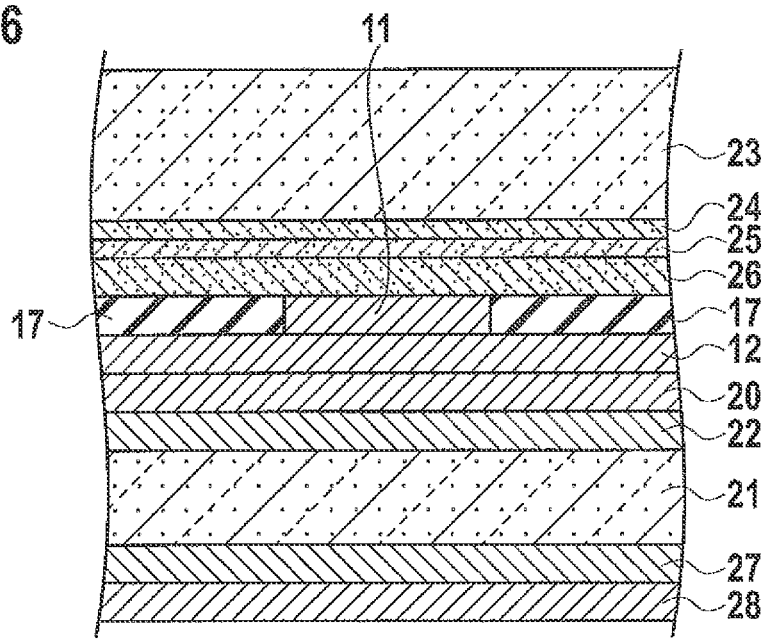
FIG. 16 is a schematic cross-sectional configuration diagram for explaining one process of the fabrication method of the semiconductor light emitting device according to the fourth embodiment of the present invention.

(c) Next, as shown in FIG. 16, the titanium layer 27 and the back surface electrode layer 28 composed of Au, etc. are formed for the back side of the silicon substrate 21 one after another using a spattering technique, a vacuum evaporation technique, etc. When not making the titanium layer 27 intervene between the Au layer and the silicon substrate 21, Au of the joined part between the silicon substrate 21 and the Au layer becomes AuSi silicide and the reflection factor is reduced if sintering is performed in order to achieve the ohmic contact. Therefore, the titanium layer 27 is a metal for bonding the silicon substrate 21 with the Au layer. In order to prevent AuSi siliciding, tungsten (W) is needed as a barrier metal, and it is necessary to form a metal layer by silicon substrate/Ti/W/Au from the substrate side as a structure at that time.

Figure 17:
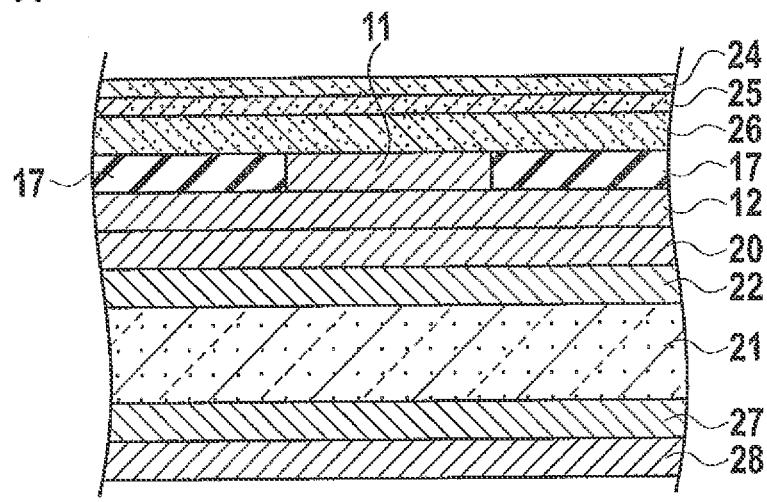
FIG. 17 is a schematic cross-sectional configuration diagram for explaining one process of the fabrication method of the semiconductor light emitting device according to the fourth embodiment of the present invention.

(d) Next, as shown in FIG. 17, after protecting the back surface electrode layer 28 by resist etc., the GaAs substrate 23 is removed by etching. The etching time is about 65 to 85 minutes by using the etching solution consisting of ammonia/hydrogen peroxide solution, for example. Here, the AlInGaP layer 24 performs an important function as an etching stopper.

Figure 18:
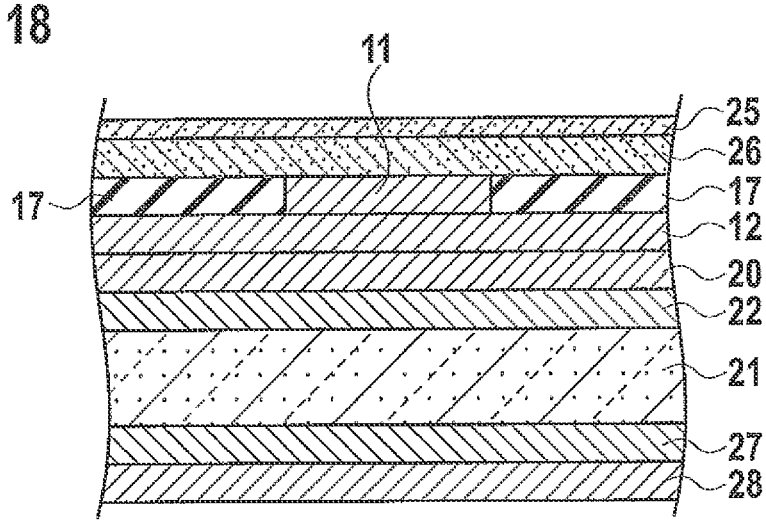
FIG. 18 is a schematic cross-sectional configuration diagram for explaining one process of the fabrication method of the semiconductor light emitting device according to the fourth embodiment of the present invention.

(e) Next, as shown in FIG. 18, the AlInGaP layer 24 is removed by using a hydrochloric acid based etching solution. The etching time is about 1 minute and a half, for example.

Figure 19:
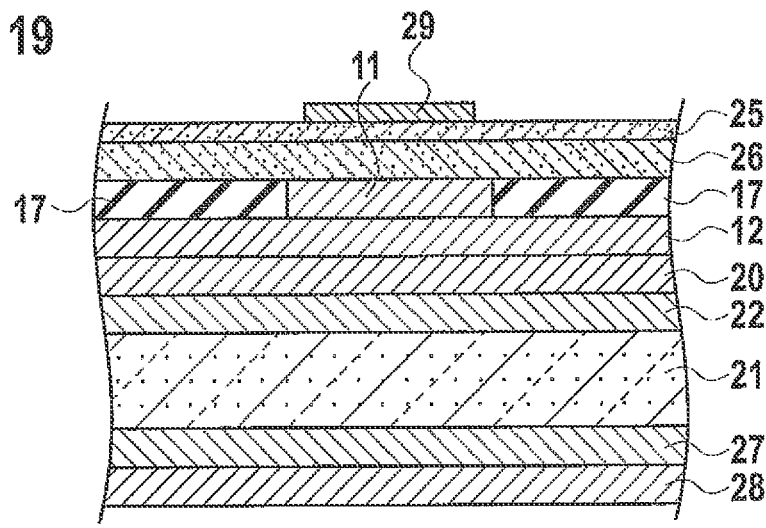
FIG. 19 is a schematic cross-sectional configuration diagram for explaining one process of the fabrication method of the semiconductor light emitting device according to the fourth embodiment of the present invention.

(f) Next, as shown in FIG. 19, the surface electrode layer 29 is patterned after formation using a spattering technique, a vacuum evaporation technique, etc. The pattern of the surface electrode layer 29 is substantially matched with the pattern of the metallic contacts layer 11. A layered structure composed of Au/AuGe—Ni alloy/Au, for example can be used as a material of the surface electrode layer 29. Here, the n type GaAs layer 25 has a removal preventing function for the surface electrode layer 29.

(g) Next, as shown in FIG. 20, the n type GaAs layers 25 except n type GaAs layer 25 directly under the surface electrode layer 29 is removed by performing frosting processing. As conditions for frosting processing, it can carry out by a nitric acid-sulfuric acid based etching solution of about 30 degrees C. to 50 degrees C. and time periods of about 5 seconds to about 15 seconds, for example. In addition, the GaO$_2$ film formed on the surface is removable by etching the n type GaAs layer 25 as preprocessing of the frosting processing using the thin liquid of fluoric acid. As the etching time, it is about 3 minutes, for example.

In addition, a tungsten (W) barrier metal, a platinum (Pt) barrier metal, etc. can also be used as an alternative of the titanium layer 22 and the titanium layer 27, for example.

According to the above explanation, as shown in FIG. 20, the semiconductor light emitting device according to the fourth embodiment of the present invention using the silicon substrate 21 is completed.

Modified Example of Fourth Embodiment

A schematic cross-section structure for explaining one process of a fabrication method of a semiconductor light emitting device according to a modified example of the present embodiment is expressed as shown in FIG. 21. Moreover, a schematic cross-section structure for explaining one process of a fabrication method of a semiconductor light emitting device according to another modified example of the present embodiment is expressed as shown in FIG. 22.

The semiconductor light emitting device according to the modified example of the present embodiment is formed by bonding mutually a silicon substrate structure shown in FIG. 11 and an LED structure shown in FIG. 12 by the wafer bonding technology, as shown in FIG. 21.

That is, as shown in FIG. 20, the semiconductor light emitting device according to the present embodiment includes: a GaAs substrate structure composed of a GaAs substrate 15, a metal buffer layer (AuGe—Ni alloy layer) 32 disposed on the GaAs substrate 15, and a metal layer (Au layer) 33 disposed on the metal buffer layer 32; and an LED structure which composed of a metal layer 12 disposed on the metal layer 33, a patterned metallic contacts layer 11 and a patterned insulating layer 17 disposed on the metal layer 12, an epitaxial growth layer 26 disposed on the patterned metallic contacts layer 11 and the patterned insulating layer 17 and having a frosting processing region 30 (region formed by performing frosting processing of the exposed n type GaAs layer 25) on the exposed surface, a patterned n type GaAs layer 25 disposed on the epitaxial growth layer 26, and a patterned surface electrode layer 29 disposed on the n type GaAs layer 25 similarly. In addition, in the GaAs substrate structure, a metal buffer layer (AuGe—Ni alloy layer) 34 and a back surface electrode layer 35 are disposed at the back side of the GaAs substrate 15. Moreover, as shown in FIG. 22, a blocking layer 31 for preventing current concentration may be disposed between the epitaxial growth layer 26 and the n type GaAs layer 25. As a material of the blocking layer 31 in this case, GaAs can be applied and the thickness is about 500 nm, for example.

Also in the semiconductor light emitting device according to the modified example of the present embodiment, as shown in FIG. 21, it is possible to form a metallic reflecting layer having a sufficient reflection factor by bonding the GaAs substrate structure and the LED structure composed of epitaxial growth layer, by using the metal layer 12. The metallic reflecting layer is beforehand formed of the metal layer 12 disposed at the LED structure side. Since a mirror surface is formed of the interface between the insulating layer 17 and the metal layer 12, the radiated light from the LED is reflected in the aforementioned mirror surface. Although the metallic contacts layer 11 is a layer for achieving the ohmic contact of the metal layer 12 and the epitaxial growth layer 26, the metallic contacts layer 11 is intervened to the interface between the metal layer 12 and the epitaxial growth layer 26, and has the thickness of the same grade as the insulating layer 17.

In the structure of FIG. 21 and FIG. 22, the metal buffer layer 34 formed at the back side of the GaAs substrate 15 is formed, for example of an AuGe—Ni alloy layer, and the thickness is about 100 nm. Moreover, the back surface electrode layer 35 is formed of an Au layer, and the thickness is about 500 nm. The metal buffer layer 32 formed on the surface of the GaAs substrate 15 is formed, for example of an AuGe—Ni alloy layer, and the thickness is about 100 nm. Furthermore, the metal layer 33 is formed of an Au layer, and the thickness is about 1 µm.

Since each process of the fabrication method of the semiconductor light emitting device according to the present embodiment shown in FIG. 11 to FIG. 20 is the same also in the fabrication method of the semiconductor light emitting device according to the modified example of the present embodiment, the explanation is omitted.

A schematic plane pattern structure of LED applied to the semiconductor light emitting device and the fabrication method for the same according to the modified example of the present embodiment can also apply the same structure as FIG. 13 or FIG. 14.

It is also available to form the metal buffer layer 18 (refer to FIG. 6) composed of Ag, Al, etc. between the insulating layer 17 and the metal layer 12 explained in the modified example of the second embodiment, also in the semiconductor light emitting device according to the present embodiment and its modified example. It is because the light of short wavelength, such as ultraviolet rays having a low reflection factor, can be efficiently reflected at Au by forming the metal buffer layer 18 composed of Ag, Al, etc.

According to the semiconductor light emitting device according to the present embodiment and its modified example, and the fabrication method for the same, the high brightness of LED can be achieved since the contact with the epitaxial growth layer 26 and the metal layer 12 can be avoided, the optical absorption can be prevented, and the metallic reflecting layer having a sufficient reflection factor can be formed by intervening the transparent insulating layer 17 between the metallic reflecting layer and the semiconductor layer.

Moreover, according to the semiconductor light emitting device according to the present embodiment and its modified example, and the fabrication method for the same, the light of short wavelength, such as ultraviolet rays having a low reflection factor, can be efficiently reflected at Au, and the high brightness of the LED can be achieved, by forming the metal buffer layer composed of Ag, Al, etc. between the insulating layer 17 and the metal layers 12 and 20.

Moreover, according to the semiconductor light emitting device according to the present embodiment and its modified example, and the fabrication method for the same, the high brightness of the LED can be achieved since the contact with the epitaxial growth layer 26 and the metal layer 12 is avoided and the light is not absorbed in the interface between the epitaxial growth layer 26 and the metallic reflecting layer.

According to the semiconductor light emitting device according to the present embodiment and its modified example, and the fabrication method for the same, the high brightness of the LED can be performed since it becomes possible to perform the total reflection of the light by using the metal for the reflecting layer in order to prevent the optical absorption to the silicon substrate or the GaAs substrate, to prevent the absorption to the silicon substrate or the GaAs substrate, and to reflect the light of all angles.

Other Embodiments

The present invention has been described by the first to fourth embodiments, as a disclosure including associated description and drawings to be construed as illustrative, not restrictive. With the disclosure, artisan might easily think up alternative embodiments, embodiment examples, or application techniques.

In the semiconductor light emitting device and the fabrication method for the same according to the first to fourth embodiment, although the silicon substrate and the GaAs substrate are mainly explained to the example as the semiconductor substrate, it is available enough in Ge SiGe, SiC, GaN substrate, or a GaN epitaxial substrate on SiC.

Although the LED is mainly explained to the example as the semiconductor light emitting device according to the first to fourth embodiment, an LD (Laser Diode) may be composed, and in that case, a DFB (Distributed Feedback) LD, a DBR (Distributed Bragg Reflector) LD, a VCSEL (Vertical Cavity Surface Emitting Laser Diode), etc. may be composed.

Such being the case, the present invention covers a variety of embodiments, whether described or not. Therefore, the technical scope of the present invention is appointed only by the invention specific matter related appropriate scope of claims from the above-mentioned explanation.

According to the semiconductor light emitting device and the fabrication method for the same according to the present invention, the high brightness of the LED can be achieved since the barrier metal becomes unnecessary by bonding the epitaxial growth layer and the semiconductor substrate by using the metal layer composed of Au in order to solve the problem of Sn diffusion by Au—Sn alloy layer, and the metallic reflecting layer having a sufficient optical reflection factor can be formed in the structure at the side of the LED by using the metal layer composed of Au.

According to the semiconductor light emitting device and the fabrication method for the same according to the present invention, the high brightness of the LED can be achieved since the contact with the semiconductor layer and the metallic reflecting layer can be avoided, the optical absorption in the interface between the semiconductor layer and the metallic reflecting layer can be prevented, and the metallic reflecting layer having a sufficient reflection factor can be formed, by inserting the transparent insulating film between the metallic reflecting layer and the semiconductor layer.

According to the semiconductor light emitting device, and the fabrication method for the same according to the present invention, the high brightness of the LED can be performed since it is possible to perform the total reflection of the light by using the metal for the reflecting layer in order to prevent the optical absorption to the GaAs substrate, to prevent the absorption to the GaAs substrate, and to reflect the light of all angles.

INDUSTRIAL APPLICABILITY

The semiconductor light emitting device and the fabrication method for the same according to the embodiments of the invention can be used for whole semiconductor light emitting devices, such as an LED device having a non-transparent substrate, such as a GaAs substrate and a Si substrate, and an LD device.

The invention claimed is:

1. A semiconductor light emitting device comprising:
a member that includes a GaAs layer;
a metal layer disposed above the GaAs layer; and
a light emitting diode structure including a patterned layer disposed above the metal layer, a p type cladding layer disposed above the patterned layer, a multi-quantum well layer disposed above the p type cladding layer, an n type cladding layer disposed above the multi-quantum well layer, and a window layer disposed above the n type cladding layer,
wherein the GaAs layer and the light emitting diode structure are bonded by using the metal layer,
wherein the patterned layer includes a layer of insulation having a predetermined thickness and having a pattern of apertures, the apertures being disposed at a predetermined pitch,
wherein the patterned layer additionally includes metal contact members in the apertures of the layer of insulation, the metal contact members having a width in a range from 5 μm to 11 μm and having a height that is substantially the same as the thickness of the layer of insulation, the metal contact members including Au, and
wherein the multi-quantum well layer is composed of a multi-quantum well structure formed by laminating a heterojunction pair composed of a GaAs/GaAlAs layer, the layer of insulation being transparent with respect to a light-emitting wavelength from the multi-quantum well layer.

2. The semiconductor light emitting device according to claim 1, further comprising a metal buffer layer disposed between the metal layer and the patterned layer.

3. The semiconductor light emitting device according to claim 2, wherein the metal layer is reflective.

4. The semiconductor light emitting device according to claim 2, wherein light radiated from the light emitting diode structure is reflected on a minor surface formed at an interface between the layer of insulation and the metal layer.

5. The semiconductor light emitting device according to claim 1, wherein the metal layer is reflective.

6. The semiconductor light emitting device according to claim 5, wherein light radiated from the light emitting diode structure is reflected on a minor surface formed at an interface between the layer of insulation and the metal layer.

7. The semiconductor light emitting device according to claim 1, wherein light radiated from the light emitting diode structure is reflected on a mirror surface formed at an interface between the layer of insulation and the metal layer.

8. The semiconductor light emitting device according to claim 4, wherein the metal buffer layer is disposed at the interface between the metal layer and the layer of insulation forms part of the minor surface.

9. The semiconductor light emitting device according to claim 6, further comprising a metal buffer layer that is disposed at the interface between the metal layer and the layer of insulation forms a part of the minor surface.

10. The semiconductor light emitting device according to claim 7, further comprising a metal buffer layer that is disposed at the interface between the metal layer and the layer of insulation forms a part of the mirror surface.

11. The semiconductor light emitting device according to claim 2, wherein the metal buffer layer is formed of at least one metal selected from the group consisting of Ag, Al, Ni, Cr, and W.

12. The semiconductor light emitting device according to claim 2, wherein the apertures are substantially round.

13. The semiconductor light emitting device according to claim 1, wherein the GaAs layer and the light emitting diode structure are bonded to each other by thermocompression-bonding the metal layer to the GaAs layer.

14. The semiconductor light emitting device according to claim 2, wherein the GaAs layer and the light emitting diode structure are bonded to each other by thermocompression-bonding the metal layer to the GaAs layer.

15. The semiconductor light emitting device according to claim 1, wherein the metal layer is an Au layer.

16. The semiconductor light emitting device according to claim 2, wherein the metal layer is an Au layer.

17. The semiconductor light emitting device according to claim 1, wherein the metal contact members are formed of at least one metal selected from the group consisting of an AuBe, an alloy of AuBe and Ni, and a layered structure of Au /AuBe-Ni alloy /Au.

18. The semiconductor light emitting device according to claim 2, wherein the metal contact members are formed of at least one metal selected from the group consisting of an AuBe, an alloy of AuBe and Ni, and a layered structure of Au /AuBe-Ni alloy /Au.

19. The semiconductor light emitting device according to claim 1, wherein the layer of insulation is formed of a silicon dioxide film, a silicon nitride film, an SiON film, an SiOxNy film, or a multilayer film thereof.

20. A semiconductor light emitting device comprising:
a member that includes a GaAs layer;
a metal layer disposed above the GaAs layer; and
a light emitting diode structure including a patterned layer disposed above the metal layer, a p type cladding layer disposed above the patterned layer, a multi-quantum well layer disposed above the p type cladding layer, an n type cladding layer disposed above the multi-quantum well layer, and a window layer disposed above the n type cladding layer, wherein the GaAs layer and the light emitting diode structure are bonded by using the metal layer, wherein the patterned layer includes a metal contact member that includes Au and that has a honeycomb pattern of polygons with openings therein, the polygons being formed by straight segments having a width in a range from 5 μm to 11 μm, the metal contact member having a predetermined height, wherein the patterned layer additionally includes insulating members in the openings of the polygons, the insulating members having a height that is substantially the same as the height of the metal contact member, and wherein the multi-quantum well layer is composed of a multi-quantum well structure formed by laminating a heterojunction pair composed of a GaAs/GaAlAs layer, the insulating members being transparent with respect to a light-emitting wavelength from the multi-quantum well layer.

\* \* \* \* \*